(12) United States Patent
Sudo et al.

(10) Patent No.: US 9,243,343 B2
(45) Date of Patent: Jan. 26, 2016

(54) VITREOUS SILICA CRUCIBLE

(75) Inventors: Toshiaki Sudo, Akita (JP); Hiroshi Kishi, Akita (JP)

(73) Assignee: SUMCO CORPORATION, Tokyo (JP)

( * ) Notice: Subject to any disclaimer, the term of this patent is extended or adjusted under 35 U.S.C. 154(b) by 1100 days.

(21) Appl. No.: 13/166,165

(22) Filed: Jun. 22, 2011

(65) Prior Publication Data

US 2011/0315071 A1  Dec. 29, 2011

(30) Foreign Application Priority Data

Jun. 25, 2010  (JP) ................................. 2010-145564

(51) Int. Cl.
| | | |
|---|---|---|
| *C30B 15/10* | (2006.01) | |
| *C30B 29/06* | (2006.01) | |
| *C30B 35/00* | (2006.01) | |

(52) U.S. Cl.
CPC .................. *C30B 15/10* (2013.01); *C30B 29/06* (2013.01); *C30B 35/002* (2013.01); *Y10T 117/1032* (2015.01)

(58) Field of Classification Search
CPC .... C30B 15/10; C30B 29/06; Y10T 117/1032
USPC .................................................. 117/13, 208
See application file for complete search history.

(56) References Cited

U.S. PATENT DOCUMENTS

| | | | |
|---|---|---|---|
| 6,106,610 A | | 8/2000 | Watanabe et al. |
| 2005/0120945 A1* | | 6/2005 | Hansen ........................... 117/15 |
| 2006/0174651 A1* | | 8/2006 | Ohama et al. .................. 65/17.3 |
| 2010/0132609 A1 | | 6/2010 | Ohama |

FOREIGN PATENT DOCUMENTS

| | | | |
|---|---|---|---|
| JP | 11-171684 A | 6/1999 | |
| JP | 2000-247778 A | 9/2000 | |
| JP | 2009084085 A * | 4/2009 | ............. C30B 29/06 |
| TW | 200912052 A | 3/2009 | |

OTHER PUBLICATIONS

Taiwan Office action, mailed Oct. 22, 2013, for Taiwan counterpart application No. 100122052.

* cited by examiner

*Primary Examiner* — Michael Kornakov
*Assistant Examiner* — Hua Qi
(74) *Attorney, Agent, or Firm* — Law Office of Katsuhiro Arai

(57) ABSTRACT

The present invention provides a vitreous silica crucible which can restrain deterioration of crystallinity of a silicon ingot in multi-pulling. Provided is a vitreous silica crucible for pulling a silicon single crystal, the crucible has a wall having, from an inner surface toward an outer surface of the crucible, a synthetic vitreous silica layer, a natural vitreous silica layer, an impurity-containing vitreous silica layer and a natural vitreous silica layer.

3 Claims, 2 Drawing Sheets

VITREOUS SILICA CRUCIBLE

CROSS-REFERENCE TO RELATED APPLICATION

This application is related to Japanese Patent Application No. 2010-145564 filed on Jun. 25, 2010, whose priory is claimed and the disclosure of which is incorporated by reference in its entirety.

BACKGROUND OF THE INVENTION

1. Field of the Invention

The present invention relates to a vitreous silica crucible and a method of manufacturing a silicon ingot.

2. Description of Related Art

In general, silicon single crystal is manufactured by melting high-purity polycrystalline silicon in a vitreous silica crucible to obtain silicon melt, dipping an end of a seed crystal to the silicon melt, and pulling the seed crystal while rotating it.

A vitreous silica crucible is a crucible made of vitreous silica, and, in general, has two-layer structure of an inner layer of a synthetic vitreous silica layer (hereinafter, referred to as "synthetic layer"), and an outer layer of a natural vitreous silica layer (hereinafter, referred to as "natural layer"). The synthetic layer is a vitreous silica layer formed by fusing and solidifying chemically synthesized amorphous or crystalline silica (silicon oxide) powder, and the natural layer is a vitreous silica layer formed by fusing and solidifying silica powder obtained from natural mineral whose main component is a-quartz. The synthetic layer has very high purity, and thus it is possible to reduce the amount of impurities mixed in the silicon melt by providing the synthetic layer as the inner layer. The natural layer has high strength, and thus it is possible to enhance strength of the crucible by providing the natural layer as the outer layer.

The melting point of silicon is 1410 deg. C., and thus the temperature of silicon melt is kept at a temperature higher than 1410 deg. C. At such temperature, a vitreous silica crucible reacts with silicon melt, and the thickness of the crucible wall gradually decreases. When the thickness of the crucible wall decreases, the strength of the crucible is lowered. This leads to problems such as buckling and sidewall lowering of the crucible.

In order to solve such problems, there is known a technique to provide a layer, between the natural layer and the synthetic layer, for promoting crystallization of vitreous silica (e,g, JP Patent 3798907). When such a layer is provided and the crucible is heated for a long time, crystallization of the synthetic layer, which is in contact with silicon melt, is promoted, and eventually the entire portion of the inner layer of the crucible is crystallized. Crystalline silica has higher strength per unit thickness than vitreous silica, and, in addition, has lower reactivity with silicon melt than vitreous silica. Therefore, the crystallization enhances strength per unit thickness and suppresses reduction of the wall thickness of the crucible.

Furthermore, there is known a technique to provide a layer, on the outside of the crucible, to promote crystallization. When such a layer is provided, the outer layer of the crucible is crystallized and the crucible strength is improved (e.g. JP-A-2000-247778).

By use of any of these techniques, the crucible strength is improved, and thus problems such as buckling and sidewall lowering of the crucible can be solved to some extent.

SUMMARY OF THE INVENTION

Conventionally, a vitreous silica crucible is used to pull a single silicon ingot, and after the single pulling, the vitreous silica crucible is discarded without being reused (such pulling is called "single pulling"). However, nowadays, for the purpose of cost reduction of a silicon ingot, a vitreous silica crucible is started to be used for multi-pulling, where after a first silicon ingot is pulled using a vitreous silica crucible, the vitreous silica crucible is re-used for pulling a second silicon ingot by re-charging and melting polycrystalline silicon before the crucible is cooled down. Thus, "multi-pulling" means pulling multiple silicon ingots using a single vitreous silica crucible.

In multi-pulling, there have appeared some problems which have not been recognized in the above-mentioned JP Patent 3798907 and JP-A-2000-247778.

First, a silicon ingot is pulled usually under Ar atmosphere. When polycrystalline silicon is recharged and melted, there has occurred a phenomenon that Ar gas stayed on the inner surface of the crucible, and it leaves the inner surface and floats in silicon melt when the next silicon single crystal is pulled. The Ar gas bubbles mix in the silicon ingot and deteriorates crystallinity of the silicon ingot, which is problematic.

Second, when a crucible is used in multi-pulling, the crucible is subjected to high temperature for a longer time. In addition, shock can be applied to the crucible when polycrystalline silicon is recharged. Thus, cristobalite particles peeled off from the outer surface of the crucible are mixed in the silicon melt, and deteriorate crystallinity of a silicon ingot, which is problematic.

These problems become apparent in multi-pulling, and were not apparent in single pulling.

The present invention has been made in view of these circumstances, and provides a vitreous silica crucible which can restrain deterioration of crystallinity of a silicon ingot in multi-pulling.

According to the present invention, provided is a vitreous silica crucible for pulling a silicon single crystal, the crucible has a wall having, from an inner surface toward an outer surface of the crucible, a synthetic layer, a natural layer, an impurity-containing vitreous silica layer (hereinafter, referred to as "impurity-containing layer") and a natural layer.

The present inventors have made extensive research, and, as a result, found out that the amount of Ar gas attached to the inner surface of a crucible increases when the inner surface is crystallized, and thus the problem of Ar gas attachment can be suppressed by suppressing crystallization of the inner surface of the crucible. In addition, the present inventors found out that a synthetic layer is easily crystallized by the effect of an impurity-containing layer when the impurity-containing layer is in direct contact with the synthetic layer, but the crystallization of the synthetic layer can be suppressed by providing a natural layer therebetween. Then, the present inventors have found out, based on these findings that it is possible to suppress crystallization at the inner surface and the outer surface of the crucible can be suppressed by a crucible having a wall having, from the inner surface to the outer surface, a synthetic layer, a natural layer, an impurity-containing layer, and a natural layer, and therefore problems such as Ar gas attachment and mixing of particles can be prevented, to accomplish the present invention.

According to the present invention, crystallization at the inner surface and the outer surface of the crucible can be suppressed, and therefore problems such as Ar gas attachment and mixing of particles can be prevented. In addition, the impurity-containing layer containing impurities is relatively easily crystallized. As mentioned above, the crystallized layer has higher per-thickness strength than that of vitreous silica, and thus problems such as buckling and sidewall lowering can be solved by the crystallization of the impurity-containing layer.

DESCRIPTION OF THE PREFERRED EMBODIMENTS

1. Configuration of Vitreous Silica Crucible

Figure 1:
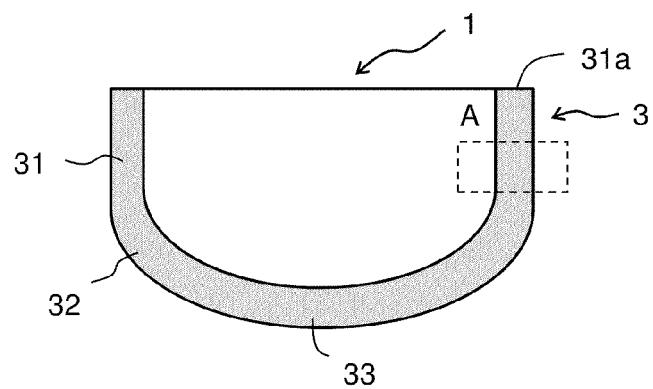
FIG. 1 is a sectional view showing structure of a vitreous silica crucible, according to an embodiment of the present invention.
Figure 2:
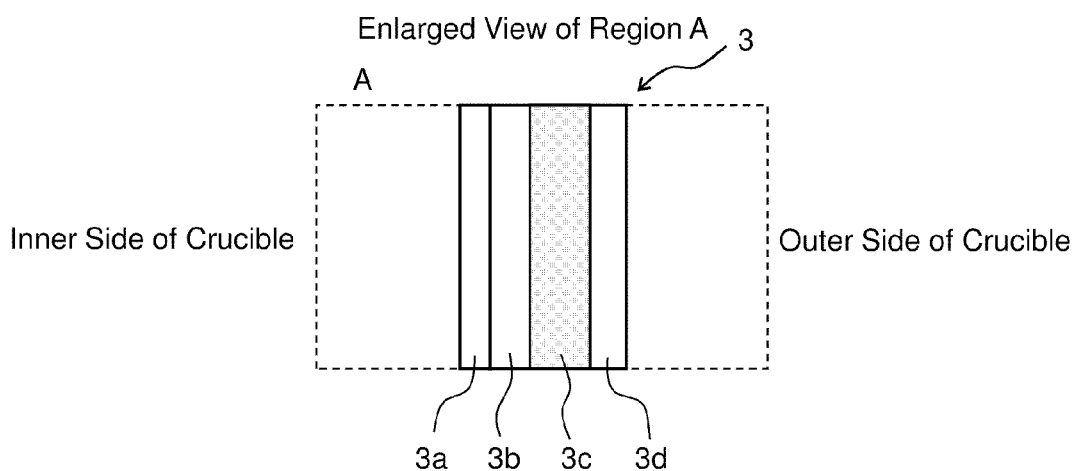
FIG. 2 is an enlarged view of the region A in FIG. 1.

Hereinafter, with reference to FIGS. 1 and 2, embodiments of a vitreous silica crucible of the present invention will be explained. FIG. 1 is a sectional view showing a structure of a vitreous silica crucible of the present embodiment, and FIG. 2 is an enlarged view of the region A in FIG. 1.

The vitreous silica crucible 1 of the present embodiment is a vitreous silica crucible 1 for pulling a silicon single crystal, and has a wall 3 having, from the inner surface toward the outer surface of the crucible, a synthetic layer 3a, a natural layer 3b, an impurity-containing layer 3c, and a natural layer 3d.

Here, the respective components are explained in detail.

(1) Vitreous Silica Crucible 1

The vitreous silica crucible 1 of the present embodiment is used for pulling a silicon single crystal, and can be used for either single pulling and multi-pulling, but it is preferred to be used for multi-pulling. This is because the vitreous silica crucible 1 of the present embodiment solves problems which are eminent in multi-pulling, much more effectively than an conventional crucible. Examples of the problems are attachment of Ar gas and mixing of particles as mentioned above.

(2) Wall 3 of Vitreous Silica Crucible

As shown in the sectional view of FIG. 1, the wall 3 of vitreous silica crucible 1 has a corner portion 32, a cylindrical sidewall portion 31, and a bottom portion 33. The corner portion 32 has a relatively large curvature. The sidewall portion 31 has a rim portion having an upward opening. The bottom portion 33 is flat or has a relatively small curvature, and is mortar-shaped. The wall 3 has, from the inner surface toward the outer surface of the crucible 1, a synthetic layer 3a, a natural layer 3b, an impurity-containing layer 3c, and a natural layer 3d. In the present invention, the corner portion refers to a portion connecting the sidewall portion 31 and the bottom portion 33, and starts at a point where a line tangential to the corner portion 32 overlaps with the sidewall portion 31 and ends at a point where the corner portion 32 and the bottom portion 33 have a common tangential line. In other words, the boundary between the sidewall portion 31 and the corner portion 32 is a point where a straight portion of the wall 3 starts to curve. Furthermore, the portion with a constant curvature at the bottom of the crucible is the bottom portion 33, and as the distance from the center of the crucible increases, a point where the curvature starts to change is the boundary between the bottom portion 33 and the corner portion 32.

(2-1) Synthetic Layer 3a

The synthetic layer 3a is an innermost layer of the crucible 1, and contacts silicon melt. The synthetic layer 3a is a layer made of vitreous silica obtained by fusing and solidifying chemically synthesized amorphous or crystalline silica (silicon oxide) (hereinafter, such vitreous silica is referred to as "synthetic vitreous silica") powder, and has very low impurity concentration. Therefore, it is possible to reduce the amount of impurities mixed in silicon melt by providing the synthetic layer 3a on the inner layer of the crucible 1. The method of chemical synthesis of silica is not in particular limited, and, may be, for example, gas phase oxidation (dry synthesis) of silicon tetrachloride ($SiCl_4$), or hydrolysis (sol-gel method) of silicon alkoxide ($Si(OR)_4$). Chemically synthesized silica does not substantially contain crystalline microstructure, and thus the structure is easily changed. Thus, the synthetic layer formed by fusing and solidifying such silica has relatively low viscosity and is easily crystallized.

(2-2) Natural Layer 3b

The natural layer 3b is a layer disposed between the synthetic layer 3a and the impurity-containing layer 3c. The natural layer 3b is a layer formed of vitreous silica obtained by fusing and solidifying silica powder obtained from natural mineral whose main component is a-quartz (hereinafter, such vitreous silica is referred to as "natural vitreous silica"). When α-quartz is fused, the viscosity is largely reduced. However, the chain structure of the repetition of SiO bond is not completely destroyed, and thus natural vitreous silica still contains crystalline microstructure therein, and thus natural vitreous silica is not easily deformed. Thus, the viscosity of the natural layer is relatively large, and is not easily crystallized. As described below, the impurity-containing layer 3c is very easily crystallized. When the synthetic layer is in contact with the impurity-containing layer 3c, crystallization of the impurity-containing layer 3c leads to crystallization of the synthetic layer. However, in the present embodiment, the synthetic layer 3a and the impurity-containing layer 3c includes the natural layer 3b therebetween, and the natural layer is not easily crystallized. Thus, crystallization of the synthetic layer 3a can be prevented. Therefore, the deterioration of crystallinity of a silicon ingot, which is caused by attachment of Ar gas, can be prevented.

(2-3) Impurity-Containing Layer 3c

The impurity-containing layer 3c is a layer disposed between the inner natural layer 3b and the outer natural layer 3d. The impurity-containing layer 3c is a vitreous silica layer containing impurities. The temperature of silicon melt during pulling of a silicon ingot is about 1450 deg. C. Under such high temperature environment, when impurities are contained in a vitreous silica layer, the impurities act as nucleus, and the vitreous silica can be relatively easily turned into crystalline silica. Because crystalline silica has higher strength than vitreous silica, the crucible 1 is strengthened by this crystallization, and thus problems such as buckling or sidewall lowering can be solved.

The kind of vitreous silica constituting the impurity-containing layer 3c is not in particular limited, and may be either synthetic vitreous silica or natural vitreous silica. In view of the purpose of improving strength by crystallization, it is preferable that the impurity-containing layer 3c made of synthetic vitreous silica, which is easily crystallized. However, in view of maintaining strength of the crucible before the crystallization, natural vitreous silica is preferred.

The kind of the impurities is not limited as long as the impurities promote crystallization of the impurity-containing layer 3c. Metal impurities are preferred because crystallization is particularly promoted when metal impurities are contained. Examples of the metal impurities are alkali metal (such as sodium or potassium), alkali earth metal (such as magnesium or calcium), aluminium. When aluminium is added, viscosity of the impurity-containing layer 3c is increased, and thus it is preferred that impurities is aluminium. The amount of impurities is not limited as long as the amount is sufficient to promote the crystallization, and thus the amount is, for example, 20 ppm or more. Furthermore, when the amount is too much, the impurities can reach the inner surface of the crucible by heat diffusion, and thus it is preferred that the amount is 500 ppm or less.

The thickness of the impurity-containing layer 3c may be constant in the sidewall portion 31, corner portion 32, and the bottom portion 33 of the wall 3. However, it is preferred that the thickness of the impurity-containing layer 3c at the bottom portion 33 is thinner than that at the sidewall portion 31, or that the impurity-containing layer 3c is not formed at the bottom portion 33. The thickness of the impurity-containing layer 3c at the bottom portion 33 is preferably ½ or less and more preferably ¼ or less of that of the sidewall portion 31. Silicon melt left in the bottom of the crucible 1 after pulling of a silicon ingot starts to solidify from the liquid surface. The volume of silicon melt increases when it solidify, and thus the solidified surface presses the crucible from the inner surface side. In addition, a carbon crucible provided on the periphery of the crucible 1 and supporting the crucible 1 is subjected to thermal contraction during cooling, and thus the carbon crucible press the crucible 1 from the outer surface side. Under such situation, if the thickness of the impurity-containing layer 3, which is difficult to deform, is large, cracks are formed on the crucible 1, and the bottom of the crucible is cracked. If the bottom of the crucible is cracked under circumstances that only the surface of the silicon melt is solidified, high-temperature silicon melt leaks from the crucible, and damages all of the peripheral apparatuses.

The boundary between the impurity-containing layer 3c and the neighboring natural layer can be determined by determining the maximum value of the concentration of impurities, and connecting points each having a concentration of one tenth of the maximum value. The concentration can be measured by using Secondary Ion Mass Spectrometry (SIMS) which can determine distribution and quantity of respective elements by irradiating a sample with ions, and analyzing, by mass spectrometry, secondary ions released from the surface of the sample by sputtering.

Specifically, a sample having a square of 10 mm×10 mm and a thickness of 3 mm is cut out from the crucible, and the sample is set on a sample holder in a way that a surface, of the sample, vertical to the inner surface of the crucible is irradiated with primary ions. Then, the sample is irradiated with the primary ions of oxygen ($O^{2+}$) or cesium ($Cs^+$) under vacuum atmosphere. Then, secondary ions released by the irradiation of the primary ions are analyzed by mass spectrometry to identify elements constituting the sample. Then, the concentrations of the respective elements of the sample can be quantitatively analyzed by the ratio of the strength of the secondary ions of the sample and the strength of the secondary ions released from a standard sample (concentrations of constituent elements of the sample are known).

The thickness of the impurity-containing layer 3c at the bottom portion 33 is preferably 50% or less and more preferably 20% or less of that of the sidewall portion 31. When the thickness is such small, the above-mentioned problem about the cracks can be prevented more certainly.

The thicknesses of the impurity-containing layer 3c at the sidewall portion 31 and the corner portion 32 are not in particular limited, but are preferably 10 to 70%, and more preferably 30 to 50% of the thickness of the wall 3. When the thicknesses are within such range, the crucible can be strengthened and the thicknesses of the natural layers 3b, 3d can be sufficiently thick so as to prevent diffusion of the impurities in the impurity-containing layer 3c to the surface of the crucible 1.

The impurity-containing layer 3c can be provided on the entire portion of the sidewall portion 31 and the corner portion 32, or can be provided on a part of the sidewall portion 31 and the corner portion 32. Even when the impurity-containing layer 3c is partially provided, the effect of strengthen the crucible can be achieved. When the impurity-containing layer 3c is provided on a part of the sidewall portion 31, the impurity-containing layer 3c is preferably provided on a part including the upper end portion 31a of the sidewall portion 31 (opening end of the crucible). When the impurity-containing layer 3c is provided on such a portion, the buckling of the crucible 1 can be effectively prevented.

(2-4) Natural Layer 3d

The natural layer 3d is provided on an outer side of the impurity-containing layer 3c. Similarly to the natural layer 3b, the natural layer 3d is not easily crystallized. Therefore, crystallization of the outer surface of the crucible can be prevented by providing the natural layer 3d on the outer side of the impurity-containing layer 3c. This prevents deterioration of crystallinity of a silicon ingot, which can be caused by mixing, into silicon melt, of particles of crystalline silica peeled-off from the outer surface of the crucible 1.

2. Method of Manufacturing Vitreous Silica Crucible

The vitreous silica crucible 1 of the present embodiment can be manufactured by the processes of (1) forming a silica powder layer for a natural layer 3d, an impurity-containing layer 3c, a natural layer 3b, and a synthetic layer 3a in this order by depositing crystalline or amorphous silica powder on the inner surface (the bottom surface and the side surface) of a rotating mold, and (2) vitrifying the silica powder layer by heating and fusing the silica powder layer up to a temperature of 2000 to 2600 deg. C. by use of arc discharge, followed by cooling.

The silica powder to form the natural layer (natural silica powder) can be manufactured by pulverizing natural mineral whose main component is a-quartz.

The silica powder to form the synthetic layer (synthetic silica powder) can be manufactured by chemical synthesis, such as gas phase oxidation (dry synthesis) of silicon tetrachloride ($SiCl_4$), or hydrolysis (sol-gel method) of silicon alkoxide ($Si(OR)_4$).

The silica powder to form the impurity-containing layer 3c can be obtained by mixing the natural or synthetic silica powder with impurities. In one example, impurities can be introduced into the silica powder by mixing the silica powder with metal alkoxide, followed by heat treatment at 600 to 1100 deg. C., to attach the impurities (in this case, metal impurities) to the surface of the silica powder.

A transparent layer having virtually no bubbles (i.e. bubble content of less than 0.5%) can be formed by subjecting the silica powder layer to a reduced pressure of −50 kPa or more and less than −95 kPa while fusing the silica powder layer. Furthermore, after the transparent layer is formed, a bubble-containing layer having a bubble content of 0.5% or more and less than 50% can be formed on the outer side of the transparent layer by subjecting the silica powder layer to a pressure of +10 kPa or more and less than −20 kPa. In the present specification, the bubble content rate refers to the ratio ($w_2/w_1$) of the volume ($w_2$) occupied by bubbles in a unit volume ($w_1$) of the crucible 1.

3. Method of Manufacturing Silicon Ingot

A silicon ingot can be manufactured by the processes of (1) forming silicon melt by melting polycrystalline silicon in the vitreous silica crucible 1 of the present embodiment, and (2) dipping an end of a silicon seed crystal to the silicon melt, and pulling the seed crystal while rotating the seed crystal. The silicon single crystal has a shape having, from the upper side, a cylindrical silicon seed crystal, a cone-shaped silicon single crystal, a cylindrical silicon single crystal having the same diameter as the base of the upper cone (hereinafter, referred to as "straight body portion"), a cone-shaped silicon single crystal having a downward apex.

In order to pull a silicon single crystal multiple times, polycrystalline silicon is recharged and melted in the vitreous silica crucible 1, and a silicon ingot is pulled again. When a conventional crucible is used for the multi-pulling, in the recharging and melting process, Ar gas is attached to the inner surface of the crucible, and particles originating from cristobalite formed on the outer surface of the crucible and peeled off therefrom are mixed in silicon melt. When Ar gas and the particles are mixed in a silicon ingot, there is a problem that the crystallinity of the silicon ingot is deteriorated. Thus, it has been difficult to obtain silicon ingots with good crystallinity when multi-pulling is performed. However, by use of the vitreous silica crucible of the present embodiment, attachment of Ar gas and generation of particles can be suppressed, and therefore silicon ingots with good crystallinity can be obtained even in multi-pulling.

EXAMPLE

1. Evaluation of Crystallinity of Silicon Ingot in Multi-pulling

Crucibles each having an outer diameter of 800 mm, and a wall thickness of 15 mm were manufactured. Crucibles in Examples and Comparative Examples were manufactured so as to have vitreous silica layers shown in Table 1. Layers in Tables 1, 3, and 4 are arranged from left to right so as to correspond to layers of a vitreous silica crucible from the inner surface side to the outer surface side. In Example 1 and Comparative Examples 1 to 2, the thickness of each of the vitreous silica layers was set to be identical at the sidewall portion and the bottom portion. The impurity-containing layer was formed for silica powder obtained by adding Al as impurities in an amount of 20 ppm to natural silica powder.

TABLE 1

|  | Synthetic Layer (mm) | Natural Layer (mm) | Impurity-Containing Layer (mm) | Natural Layer (mm) |
|---|---|---|---|---|
| Ex. 1 | 1 | 4 | 5 | 5 |
| Comp. Ex. 1 | 1 | — | 5 | 9 |
| Comp. Ex. 2 | 1 | 9 | 5 | — |

Three silicon ingots each having a diameter of 300 mm were pulled by use of the crucibles of Example 1 and Comparative Examples 1 and 2. Each time one silicon ingot was pulled, polycrystalline silicon was recharged and melted. Crystallinity of the three silicon ingots were evaluated. Evaluation of the crystallinity was performed based on the single crystallization yield. The single crystallization yield was a value of (mass of straight body section of silicon single crystal)/(mass of silicon melt charged in the crucible right before pulling). The results are shown in Table 2. The evaluation criteria in Table 2 are as follows:

A: single crystallization yield is 0.80 or more and less than 0.99
B: single crystallization yield is 0.70 or more and less than 0.80
C: single crystallization yield is 0.60 or more and less than 0.70
D: single crystallization yield is less than 0.60

TABLE 2

|  | First Ingot | Second Ingot | Third Ingot |
|---|---|---|---|
| Ex. 1 | A | A | A |
| Comp. Ex. 1 | A | C | D |
| Comp. Ex. 2 | A | C | D |

As is clear from Table 2, crystallinity of the first silicon ingot was good for any cases where the crucibles of Example 1, and Comparative Examples 1 and 2 were used. However, for the second and third silicon ingot, the crystallinity for the case where the crucible of Example 1 was used was much better than that for the case where the crucibles of Comparative Examples 1 and 2 were used. These results show that silicon ingots with good crystallinity can be obtained by use of the crucible of the present invention, even when multi-pulling is performed.

2. Evaluation of Crack-Resistance and Strength of Crucible

The thickness of the impurity-containing layer at the sidewall portion and the bottom portion of the crucible was changed in various ways to manufacture the crucibles of Examples 2 to 9. Each of the crucibles of Examples 2 to 9 has an outer diameter of 800 mm and a wall thickness of 15 mm.

In the crucible of Example 2, the thickness of each of the vitreous silica layers was set to be identical at the sidewall portion and the bottom portion. In Example 3, the thickness of the impurity-containing layer at the bottom portion was 0 mm, and in Example 4, the thickness of the impurity-containing layer at the bottom portion was larger than that at the sidewall portion and the corner portion.

In the crucibles of Examples 5 to 7, the thicknesses of the impurity-containing layer at the sidewall portion and the corner portion were 10%, 40%, and 70% of the wall thickness, respectively. The thickness of the impurity-containing layer at the bottom was half of that at the sidewall portion. In Examples 8 and 9, the thicknesses of the impurity-containing layer at the sidewall portion and the corner portion were 6.7% and 80% of the wall thickness, respectively, and the thickness of the impurity-containing layer at the bottom was half of that at the sidewall portion.

TABLE 3

|  |  | Synthetic Layer (mm) | Natural Layer (mm) | Impurity-Containing Layer (mm) | Natural Layer (mm) |
|---|---|---|---|---|---|
| Ex. 2 | Sidewall Portion | 1 | 6 | 5 | 3 |
|  | Corner Portion |  |  |  |  |
|  | Bottom Portion | 1 | 6 | 5 | 3 |
| Ex. 3 | Sidewall Portion | 1 | 6 | 5 | 3 |
|  | Corner Portion |  |  |  |  |
|  | Bottom Portion | 1 | 6 | 0 | 8 |
| Ex. 4 | Sidewall Portion | 1 | 6 | 5 | 3 |
|  | Corner Portion |  |  |  |  |
|  | Bottom Portion | 1 | 6 | 7 | 1 |

TABLE 4

|  |  | Synthetic Layer (mm) | Natural Layer (mm) | Impurity-Containing Layer (mm) | Natural Layer (mm) |
|---|---|---|---|---|---|
| Ex. 5 | Sidewall Portion | 1 | 6 | 1.5 | 6.5 |
|  | Corner Portion |  |  |  |  |
|  | Bottom Portion | 1 | 6 | 0.75 | 7.25 |
| Ex. 6 | Sidewall Portion | 1 | 4 | 6 | 4 |
|  | Corner Portion |  |  |  |  |
|  | Bottom Portion | 1 | 7 | 3 | 4 |

TABLE 4-continued

|   |   | Synthetic Layer (mm) | Natural Layer (mm) | Impurity-Containing Layer (mm) | Natural Layer (mm) |
|---|---|---|---|---|---|
| Ex. 7 | Sidewall Portion | 1 | 2 | 10.5 | 1.5 |
|  | Corner Portion |  |  |  |  |
|  | Bottom Portion | 1 | 4 | 5.25 | 4.75 |
| Ex. 8 | Sidewall Portion | 1 | 6 | 1 | 3 |
|  | Corner Portion |  |  |  |  |
|  | Bottom Portion | 1 | 6 | 0.5 | 1 |
| Ex. 9 | Sidewall Portion | 1 | 1 | 12 | 1 |
|  | Corner Portion |  |  |  |  |
|  | Bottom Portion | 1 | 4 | 6 | 4 |

Figure 3:
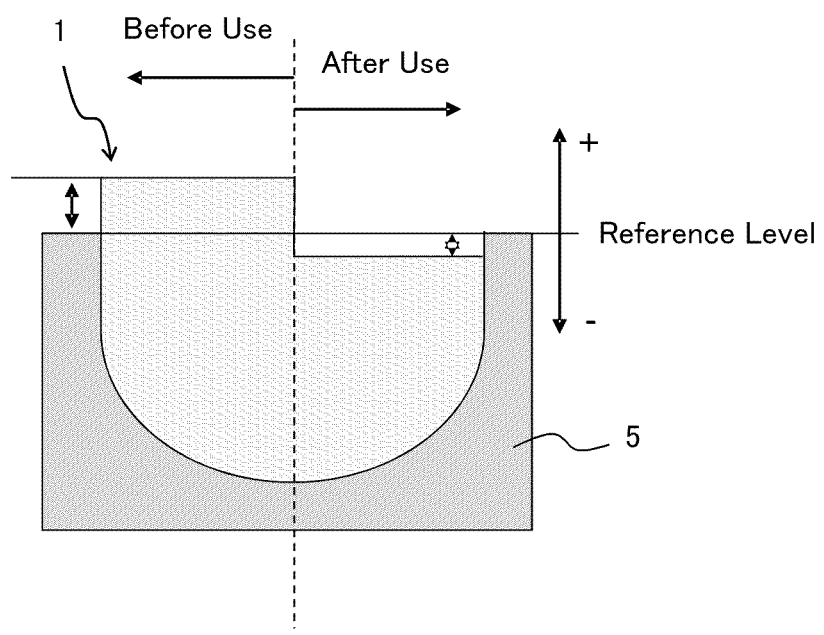
FIG. 3 is a sectional view for explaining evaluation criteria of a crucible in Examples.

For the crucibles of Example 2 to 9, crack-resistance and strength were evaluated. Crack-resistance was evaluated by observing cracks at the bottom of the crucible and leakage of silicon melt from the crucible. Strength was evaluated based on the amount of sidewall lowering obtained by measuring, before and after use, the distance from the reference level (which is the upper end of the carbon susceptor 5) to the upper end of the crucible 1 (See FIG. 3). The results are shown in Table 4. The evaluation criteria are shown below.

Crack-Resistance:
There are no cracks at the crucible bottom and no leakage of silicon melt: A
Cracks exists at the crucible bottom, but there is no leakage of silicon melt: B
There is leakage of silicon melt: C Strength:
A: the amount of sidewall lowering is less than 10 mm
B: the amount of sidewall lowering is 10 mm or more and less than 20 mm
C: the amount of sidewall lowering is 20 mm or more and less than 30 mm
D: the amount of sidewall lowering is 30 mm or more

TABLE 5

| No. | Crack-Resistance | Strength |
|---|---|---|
| Ex. 2 | B | A |
| Ex. 3 | A | A |
| Ex. 4 | C | A |

TABLE 6

| No. | Crack-Resistance | Strength |
|---|---|---|
| Ex. 5 | A | B |
| Ex. 6 | A | A |
| Ex. 7 | A | B |
| Ex. 8 | A | D |
| Ex. 9 | A | C |

As is clear from Table 5, the crucible of Example 3 is excellent in the crack-resistance and strength. This shows that (1) it is preferable, in terms of the crack-resistance, to have the thickness of the impurity-containing layer at the bottom portion smaller than that at the sidewall portion.

Furthermore, as is clear from Table 6, the crucibles of Examples 5 to 7 are excellent in the crack-resistance and strength. This shows that (2) it is preferable, in terms of the crack-resistance, to have the thickness of the impurity-containing layer at the sidewall portion 70% or less of the wall thickness, and (3) it is preferable, in terms of the strength, to have the thickness of the impurity-containing layer at the sidewall portion 30% or more of the wall thickness.

What is claimed is:

1. A vitreous silica crucible for pulling a silicon single crystal, the crucible has a wall having, from an inner surface toward an outer surface of the crucible, a synthetic vitreous silica layer, a natural vitreous silica layer, an impurity-containing vitreous silica layer and a natural vitreous silica layer, wherein the natural vitreous silica layers are no-impurity-added layers, and the thickness of the impurity-containing vitreous silica layer at a bottom portion of the crucible is not zero but smaller than that of the impurity-containing vitreous silica layer at a sidewall portion of the crucible.

2. The crucible of claim 1, wherein the thickness of the impurity-containing vitreous silica layer at a sidewall portion and a corner portion is 30% to 70% of the thickness of the wall.

3. The crucible of claim 1, wherein the impurity-containing vitreous silica layer contains impurities in an amount of 20 to 500 ppm.

* * * * *